United States Patent [19]

Kay et al.

[11] Patent Number: 6,005,437

[45] Date of Patent: Dec. 21, 1999

[54] BRIDGED DRIVING AMPLIFIER AND A TELECOMMUNICATION DEVICE

[75] Inventors: Malcolm J. Kay, Lockleys; Philip A. Tracy, Epping, both of Australia

[73] Assignee: U.S. Philips Corporation, New York, N.Y.

[21] Appl. No.: 09/054,105

[22] Filed: Apr. 2, 1998

[30] Foreign Application Priority Data

Apr. 7, 1997 [EP] European Pat. Off. .............. 97201027

[51] Int. Cl.⁶ ..................................................... H03F 3/00
[52] U.S. Cl. ............................................. 330/146; 330/51
[58] Field of Search ........................... 330/51, 146, 174; 381/372, 375, 382, 30, 373

[56] References Cited

U.S. PATENT DOCUMENTS

| | | | |
|---|---|---|---|
| 3,629,616 | 12/1971 | Walker | 307/254 |
| 4,581,565 | 4/1986 | Van Pelt et al. | 318/294 |
| 5,631,605 | 5/1997 | Bailly | 330/146 |

FOREIGN PATENT DOCUMENTS

35054782C2 8/1986 Germany .......................... H04R 3/00

OTHER PUBLICATIONS

Data Sheet of the UBA 1702 Integrated Circuit, Philips Semiconductors, Jan. 9, 1996, pp. 1–24.

*Primary Examiner*—Robert Pascal
*Assistant Examiner*—Henry Choe

[57] ABSTRACT

A bridged driving amplifier for driving a capacitive load comprises a first and a second output terminal, and a first and a second supply rail. A first driving section is coupled between the first supply rail and the first output terminal. A second driving section is coupled between the second output terminal and the second supply rail. A third driving section is coupled between the first supply rail and the second output terminal. A fourth driving section is coupled between the first output terminal and the second supply rail. The bridged amplifier is AC-driven such that the first and the second section, when driven, cause an output voltage across the capacitive load of a given polarity, and that the third and the fourth section, when driven, cause an output voltage across the capacitive load of a polarity opposite to the given polarity. The bridged driving amplifier comprises inhibiting means for inhibiting that at least a part of the supply current is inhibited when the capacitive load is discharged during voltage state changing of the voltage across the capacitive load from the one polarity to the other polarity.

5 Claims, 2 Drawing Sheets

BRIDGED DRIVING AMPLIFIER AND A TELECOMMUNICATION DEVICE

BACKGROUND OF THE INVENTION

The present invention relates to a bridged driving amplifier for driving a capacitive load which is coupled between a first and a second output terminal of the bridged driving amplifier, which bridged driving amplifier comprises a first driving section coupled between a first supply rail and the first output terminal, a second driving section coupled between the second output terminal and a second supply rail, a third driving section coupled between the first supply rail and the second output terminal, and a fourth driving section coupled between the first output terminal and the second supply rail, whereby the bridged driving amplifier is AC-driven such that the first and the second section, when driven, cause an output voltage across the capacitive load of a given polarity, and the third and the fourth section, when driven, cause an output voltage across the capacitive load of a polarity opposite to the given polarity. Such a bridged driving amplifier can be used in a telecommunication device such as a wired telephone for driving a piezo electrical acoustic transducer for generating a ringing signal, or any other bridged driving amplifier used for driving a capacitive load and driven by an AC-signal. The transducer can be a capacitive transducer having a relatively low dissipation factor and can thus also be a piezo fan, or the like.

The present invention further relates to a telecommunication device comprising such a bridged driving amplifier.

A bridged driving amplifier of the above kind is known from the Data Sheet of the UBA1702 Integrated Circuit, Philips Semiconductors, Jan. 9, 1996, pp. 1–24. On page 4 of this data sheet a block diagram of the UBA1702 is given. Shown is a bridged piezo driving amplifier for driving a piezo electrical acoustic transducer for generating a ringing signal at a typical frequency of 1 kHz. Such a conventional bridged driving amplifier comprises four driving sections of which two are active at a time, for each AC-cycle of an input signal. Driving the bridged driving amplifier causes a switching sequence of charging the capacitive load to a given voltage with a given polarity, discharging the capacitive load, and charging the capacitive load to a voltage of a polarity opposite to the given polarity. This sequence is a cyclic process comprising four states. The conventional bridged driving amplifier is not very efficient because for both charging and discharging currents are drawn from the current supply. Particularly in telephone applications it is desirable to have a more efficient bridged driving amplifier for driving a capacitive ringer.

The German patent DE 35 05 478 describes a more efficient bridged driving amplifier. It is proposed to keep output terminals of the bridged driving amplifier at the same potential during discharging of the capacitive load. No detailed embodiments are shown, only a schematic operation of such a sequence switching. The present invention is aimed to give different solutions to the same basic problem.

OBJECTS AND SUMMARY OF THE INVENTION

It is an object of the present invention to provide an efficient bridged driving amplifier for driving a capacitive load, particularly a piezo electrical acoustic transducer such as a ringer.

To this end the bridged driving amplifier according to the present invention is characterised in that the bridged driving amplifier comprises inhibiting means for inhibiting that at least a part of the supply current is inhibited when discharging the capacitive load during voltage state changing of the voltage across the capacitive load from the one polarity to the other polarity. Herewith it is achieved that at least during a part of discharging of the capacitive load no supply current is used or at least a reduction of the use of supply current is achieved so that a reduced power consumption is obtained. In a wired telephone application a better use is thus made of the limited available line current, or, a louder ringing sound or a lower cost transducer for the same sound could be achieved.

In an embodiment of a bridged driving amplifier according to the present invention the inhibiting means are formed by voltage change prevention means distributed over the first and the second driving section, and the third and the fourth driving section, respectively, to prevent instantaneous voltage changes at the output terminals beyond a predetermined voltage change, further voltage changes at the output terminals being due to gradual changes on the capacitive load. Herewith, no supply current is used for at least during part of the time for discharging the capacitive load, whereas the circuit is simple and does not have complicated switching means.

In another embodiment of a bridged driving amplifier according to the present invention the inhibiting means are formed by arranging that the current driving capabilities of the first and the second driving section, and the third and the fourth driving section, have a predetermined ratio, respectively, and by current return paths between the output terminal and at least one of the supply rails. Herewith a very simple means is given to get a better efficiency of the bridged driving amplifier. The ratio can be obtained by applying conventional current limiting means in the driving sections.

More detailed embodiments are claimed in the other dependent claims.

BRIEF DESCRIPTION OF THE DRAWING

The present invention will now be described, by way of example, with reference to the accompanying drawings, wherein FIG. 1 schematically shows a block diagram of a telecommunication device including a bridged driving amplifier according to the present invention.

Throughout the figures the same reference numerals are used for the same features.

DETAILED DESCRIPTION OF THE PREFERRED EMBODIMENT

Figure 1:
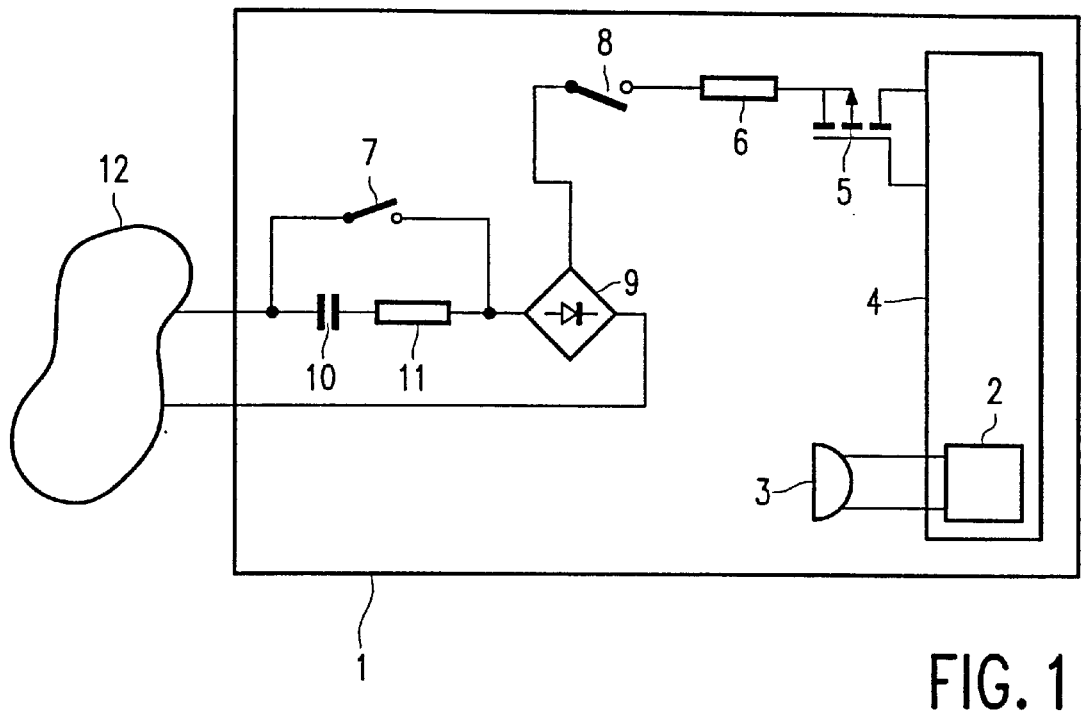

FIG. 1 schematically shows a block diagram of a telecommunication device 1 including a bridged driving amplifier 2 according to the present invention driving a ringer 3, a piezo electrical acoustic transducer which forms a capacitive load for the amplifier 2. In a conventional IC such as the IC 4 of type UBA1702 supply current is drawn during discharging of the load 3 when changing state as described, from one polarity to another polarity. According to the present invention, more efficient amplifiers are provided. Further shown is conventional telephone circuitry, such an interrupter MOSFET 5, a protection resistor 6, a double hook switch 7, 8, a diode bridge 9, and a capacitor 10 and a resistor 11 bridging the hook switch 7. The telecommunication device, a wired telephone, for instance, is coupled to the public switched telephone network 12.

Figure 2:
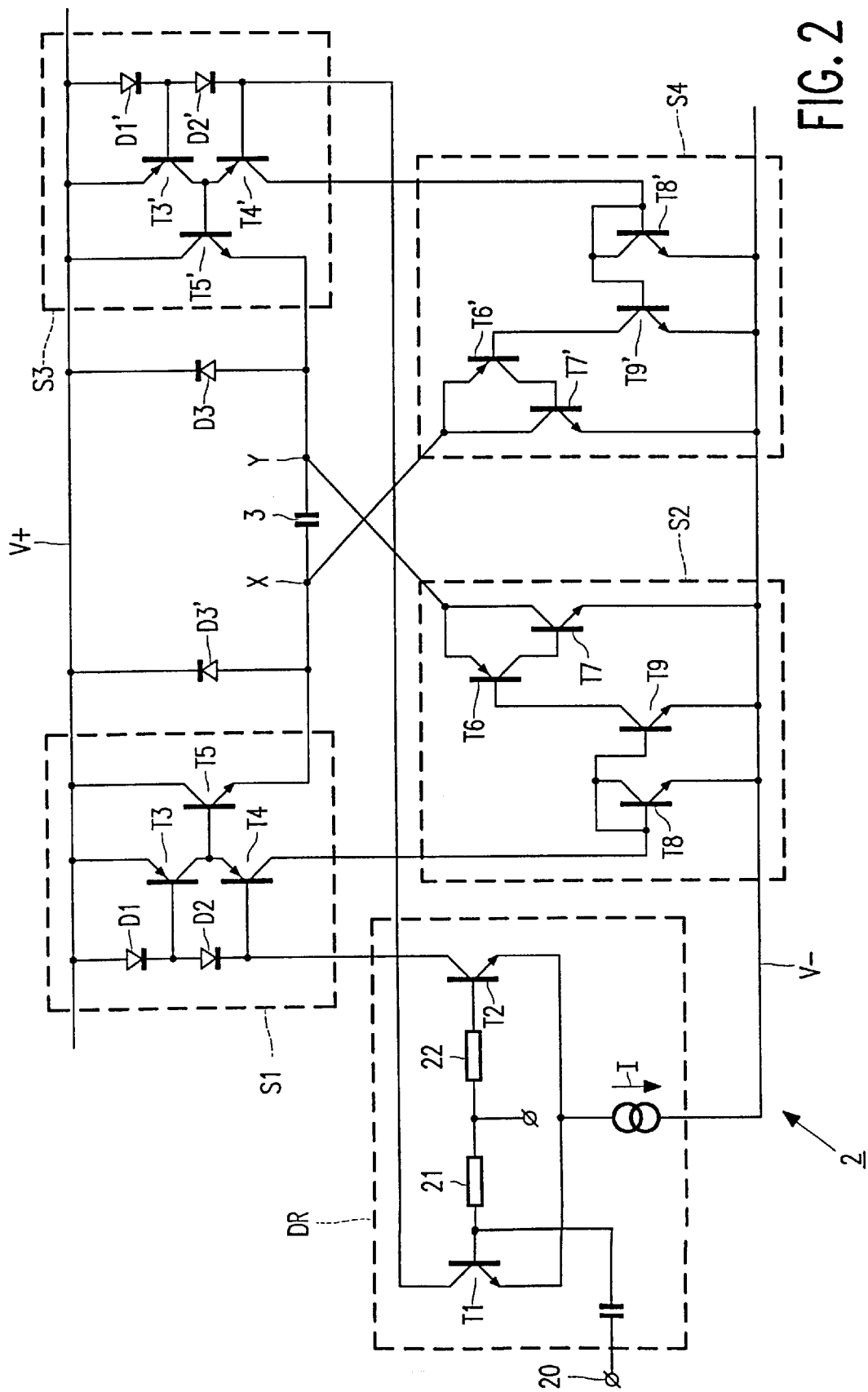
FIG. 2 shows a detailed circuit diagram of a first embodiment of a bridged driving amplifier according to the present invention.

FIG. 2 shows a detailed circuit diagram of a first embodiment of a bridged driving amplifier 2 according to the present invention comprising a first driving section S1 coupled between a first supply rail V+ and a first output terminal X of the bridged driving amplifier 2, a second driving section S2 coupled between a second output terminal Y and a second supply rail V−, a third driving section S3 coupled between the first supply rail V+ and the second output terminal Y, and a fourth driving section S4 coupled between the first output terminal X and the second supply rail V−. In the example given V+=10 Volts and V−=0 Volts. Further shown is a differential pair DR for driving the sections S1, S2, S3 and S4. The sections S1 and S2, and S3 and S4 are mutually exclusive active at respective half cycles of an AC input signal at an input 20 of the bridged driving amplifier 2. Further shown are diodes D3' and D3 coupled between the respective output terminals X and Y and the first supply rail V+. The differential pair DR comprises transistors T1 and T2 and resistors 21 and 22 between at bases for biasing. Emitters of the transistors T1 and T2 are coupled to each other and to a current source providing a current I. The driving section S1 comprises transistors T3 and T4 whose main current paths are connected in series between the first supply rail V+ and an input of the driving section S2. A base of the transistor T3 is coupled to the rail V+ via a diode D1 and to a base of the transistor T4 via a diode D2. A collector of the transistor T3 is coupled to an emitter of the transistor T4 and to a base of a transistor T5 of which a main current path is coupled between the rail V+ and the output terminal X. The driving section S2 comprises transistors T6 and T7 at output side and transistors T8 and T9 at input side. Similarly, the driving section S3 comprises transistors T3', T4' and T5' and diodes D1' and D2'. The driving section S4 comprises transistors T6', T7', T8' and T9'.

In the following the operation of the bridge driving amplifier 2 will be described. The transistor T1 drives one half of the bridge and the transistor T2 drives the other half. A 1 kHz driving input signal at the input 20 is taken, for instance. The bridge operates in an auto sequencing mode. For the operation of the bridge an initial state is taken where the transistor T2 has been off and T1 on, so that the amplifier output Y has previously been switched towards V+=10 Volts and the amplifier output X has been switched to V−=0 Volts by the driving sections S3 and S4. So the capacitive load 3 becomes charged with positive on the output terminal Y and negative on the terminal X. The terminal Y will have reached 10 V minus the drop associated with the circuit T3' and T5'. The base of T4' will be two diode drops below V+. A diode forwards voltage drop of 0.6 Volts is assumed. The current in the transistor T3' will pull the transistor T5' towards V+ but the emitter-base conduction of T4' will hold the base of the transistor T5' at one diode voltage below V+, namely at 10 V−0.6 V=9.4 V. The drop across the transistor T5' is its emitter-base voltage which we also take to be 0.6 V. So the output terminal Y will be held at 10 V−1.2 V=+8.8 V. The terminal X will have reached 0 V minus the drop across the transistor pair T6', T7'. That voltage drop will be 0.6 V for T6' plus 0.1 V for T9'=0.7 V. So the terminal X will be held at +0.7 V. The voltage across the capacitor 3=8.8 V−0.7 V=8.1 V. The currents in all the driving amplifiers will approach zero after the capacitive load 3 is charged.

Next the driving signal at the input 20 is reversed so that the transistor T1 switches off and the transistor T2 switches on. The current at the collector of the transistor T2 becomes approximately equal to the current source I flowing in the diodes D1 and D2. The diode D1 and the transistor T3 are made equal in geometry (current mirror) so that the collector current of the transistor T3 also becomes equal to the current I. Since the output terminal X is at +0.7 V, the base of the transistor T5 and the emitter of the transistor T4 cannot be above 0.7 V+0.6 V=1.3 V. The base of the transistor T4 cannot be lower in voltage than V+ minus the drop on the diodes D1 and D2, so cannot be less than 10−1.2=8.8 V. So the transistor T4 is therefore reverse biased by 8.8−1.3 V=7.5 V and cannot conduct. That means there can be no current to the transistors T8 and T9 and these are off. There is thus no action by the transistor T6 to pull the terminal Y towards 0 V at this time.

The drive current at the collector of the transistor T3 causes a current in the transistor T5 which tries to raise the voltage at the terminal X. But coupling through the capacitor 3 means the voltage at the output terminal Y must also rise. As soon as the voltage at the terminal Y increases from 8.8 V to 10.6 V the diode D3 will conduct and the terminal Y cannot rise any further. So the terminal X increases by only 1.8 V before it is restricted by the capacitive load 3 and the diode D3. This means it increases instantly from 0.7 V to 2.5 V and then the current in the transistor T5 causes a further increase in the voltage at the terminal X, towards the positive supply rail V+, only by changing the charge on the capacitive load 3. During this process the current flowing from the supply in the transistor T5 is returned to the supply via the diode D3. The result is, in fact, that the capacitive load 3 is now being discharged from 8.1 V towards 1.8 V without using any (significant) power supply current. It is changed from the state X=2.5 V, Y=10.6 V to the state X=8.8 V, Y=10.6 V without using supply current.

Now when the voltage at the transistor T5 reaches a level which is one diode voltage below V+ the emitter-base junction of the transistor T4 can become forward biased because its base voltage is two diode voltage drops below V+. When the transistor T4 conducts it prevents any further rise in voltage at the base of the transistor T5 and that means the transistor T5 no longer causes any increase in the voltage at the terminal X. The base of the transistor T5 is still held up at one diode voltage drop below V+ and the current available to flow in the transistor T4 equals the current in the transistor T3 minus any small base current to hold the base of the transistor T5 at one diode voltage drop below V+. So now the transistor T8 is driven by the current from the transistor T4. An equal current flows in the collector of the transistor T9 if the transistors T8 and T9 are matched transistors. The transistor T9 drives the transistor T6, assisted by the transistor T7, to pull the terminal Y of the capacitive load 3 towards V−. The capacitive load 3 is now charged using current flowing from the supply V+, via the transistors T5, T6, and T7 until charging ceases with the terminal X being about two diode drops below V+ and the terminal Y about one diode drop (the drop across the transistor T6 and the saturation voltage of T9) above V−. So the terminal X is at 8.8 V and the terminal B is at 0.7 V. The state of the capacitive load has changed from X=8.8 V, Y=10.6 V to X=8.8 V, Y=0.7 V. This completes one half cycle. The supply current drawn from the supply during this half cycle will be that required to charge the capacitive load 3 from the state X=8.8 V, Y=10.6 V, to X=8.8 V, Y=0.7 V, which is a voltage change of 9.9 V. In total the capacitive load 3 was changed from the state X=0.7 V, Y=8.8 V to X=8.8 V, Y=0.7 V, which represented a voltage change of 16.2 V. So a charging of the capacitor was achieved of 16.2 V−9.9 V=6.3 V without using supply current. The decrease in current consumption compared to a conventional bridged driving amplifier when driving 16.2 V peak to peak across the same capacitive load is 39%.

Figure 3:
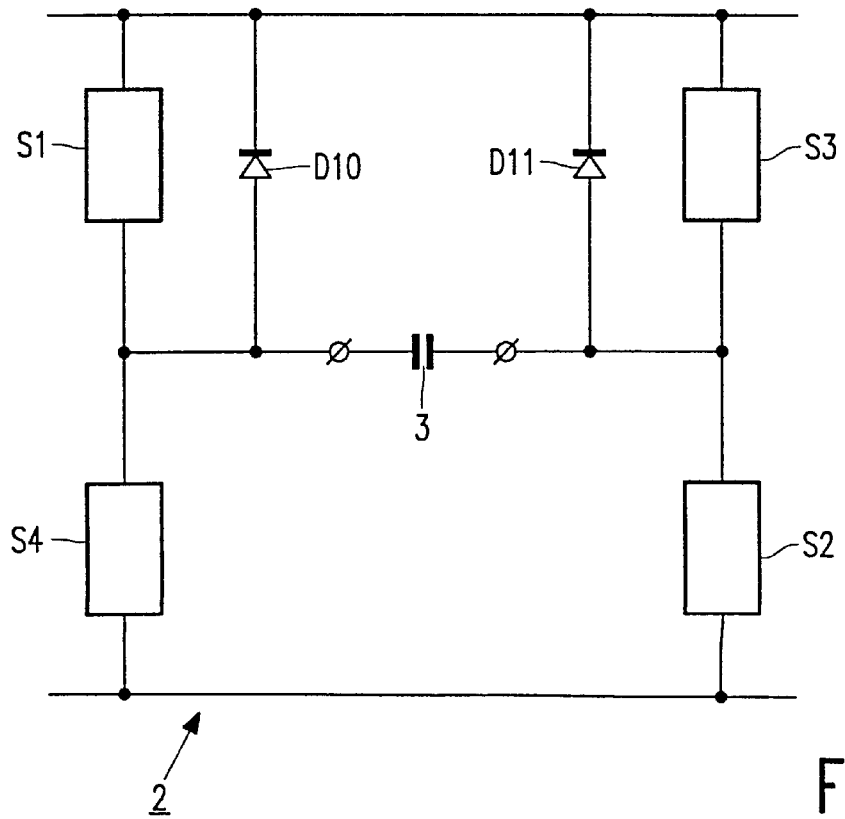
FIG. 3 shows a block diagram of a second embodiment of a bridged driving amplifier according to the present invention.

FIG. 3 shows a block diagram of a second embodiment of a bridged driving amplifier according to the present invention. The driving sections S1 and S3 are designed to have a current drive capability of 4 for instance, while the driving sections S2 and S4 are designed to have a current drive capacity of 1 unit of current. The sections S2 and S4 use conventional current limiting techniques to ensure that the ratio of drive current from the driving sections S1 and S3 will be 4 times that of the driving sections S2 and S4. Driving of the bridged driving amplifier is as with conventional bridged driving amplifiers such as in the IC of type UBA1702. The driving sections S1 and S2 are made active while the driving sections S3 and S4 are inactive, then the driving sections S3 and S4 are made active while the driving sections S1 and S2 are inactive. So the terminals X and Y of the capacitive load 3 are firstly driven by the driving sections S1 and S2 towards V+ and V− respectively. Next they are driven towards V− and V+ respectively by the driving sections S3 and S4.

As an initial state it is taken that the driving sections S1 and S2 are active. So the output terminal X is at V+ and the output terminal Y is at V−. V+=10 V and V=0 V, for instance. The driving sections are designed to be capable of driving the terminals X and Y to the supply rails V+ and V−, i.e., the initial state is X=10 V, Y=0 V. Now the driving sections S1 and S2 become inactive and do not affect the voltages at the terminals X or Y. The driving sections S3 and S4 become active, but the driving section S4 has only ¼ the current capability of the driving section S3. So the driving section S3 will try to pull the output terminal Y from 0 V up to 10 V. But this means the output terminal X must rise from 10 V to 20 V by coupling via the capacitive load 3. Diode D10 will conduct to prevent this. The terminal X will rise to 10.6 V and then the terminal Y will rise only as the capacitive load 3 is charged with current from the driving section S3. The driving section S4 is active and sinking a current ¼ of the current in the driving section S3. Now the net current flowing from the supply rail V+ into the terminal Y is 4 units, the current in the diode D10 is 4 units minus the one unit which flows into the driving amplifier S4. The capacitive load charges until the terminal Y reaches 10 V at which time the current in the diode D10 falls to zero and so the current in the driving section S3 falls to one unit of current, flowing through the capacitive load 3 and via the driving section S4 to the supply rail V−. This current continues until the terminal X is changed from 10.6 V down to zero volts at which time no more current can flow in either driving section. The current flowing from the supply via the driving section S3 is 4 units, but 3 units return to the supply via the diode 10. The net current flowing from the supply rail while the capacitive load 3 changes from the state X=10.6 V, Y=0.6 V to X=10.6 V, Y=10 V is only the current that flows in the driving section S4. The current flowing from the supply rail while the capacitive load 3 changes from the state X=10.6 V, Y=10 V to X=0 V, Y=10 V is also one unit of current, flowing in the driving section S4. Now the capacitive load 3 has been changed from the state X=10.6 V, Y=0.6 V to X=10.6 V, Y=10 V by 3 units of current that do not flow as net supply current. From a charge balance as compared to a conventional bridged driving amplifier it can easily be found that a saving of 32.25% is achieved. When choosing a much higher ratio an even better result will be achieved.

In view of the foregoing it will be evident to a person skilled in the art that various modifications may be made within the spirit and the scope of the present invention as hereinafter defined by the appended claims and the present invention is thus not limited to the examples provided.

We claim:

1. A bridged driving amplifier for driving a capacitive load which is coupled between a first and a second output terminal of the bridged driving amplifier, which bridged driving amplifier comprises a first driving section coupled between a first supply rail and the first output terminal, a second driving section coupled between the second output terminal and a second supply rail, a third driving section coupled between the first supply rail and the second output terminal, and a fourth driving section coupled between the first output terminal and the second supply rail, whereby the bridged driving amplifier is AC-driven such that the first and the second section, when driven, cause an output voltage across the capacitive load of a given polarity, and the third and the fourth section, when driven, cause an output voltage across the capacitive load of a polarity opposite to the given polarity, the bridged driving amplifier further comprising inhibiting means for inhibiting that at least a part of the supply current is inhibited when discharging the capacitive load during voltage state changing of the voltage across the capacitive load from the one polarity to the other polarity, the inhibiting means being formed by voltage change prevention means distributed over the first and the second driving section, and the third and the fourth driving section, respectively, to prevent instantaneous voltage changes at the output terminals beyond a predetermined voltage change, and further voltage changes at the output terminals being due to gradual charge changes on the capacitive load.

2. A bridged driving amplifier according to claim 1, wherein the voltage change prevention means are formed by a first transistor comprised in the first driving section driven by one cycle of an AC-signal so as to prevent the second section from becoming active until the discharging of the capacitive load has been completed, and by a first diode coupled between the first supply rail and the second output terminal, and by a second transistor comprised in the third driving section driven by the other cycle of the AC-signal, so as to prevent the fourth section from becoming active until the discharging of the capacitive load has been completed, and by a second diode coupled between the first supply rail and the first output terminal.

3. A bridged driving amplifier for driving a capacitive load which is coupled between a first and a second output terminal of the bridged driving amplifier, which bridged driving amplifier comprises a first driving section coupled between a first supply rail and the first output terminal, a second driving section coupled between the second output terminal and a second supply rail, a third driving section coupled between the first supply rail and the second output terminal, and a fourth driving section coupled between the first output terminal and the second supply rail, whereby the bridged driving amplifier is AC-driven such that the first and the second section, when driven, cause an output voltage across the capacitive load of a given polarity, and the third and the fourth section, when driven, cause an output voltage across the capacitive load of a polarity opposite to the given polarity, the bridged driving amplifier further comprising inhibiting means for inhibiting that at least a part of the supply current is inhibited when discharging the capacitive load during voltage state changing of the voltage across the capacitive load from the one polarity to the other polarity, the inhibiting means being formed by arranging that the current driving capabilities of the first and second driving section, and the third and fourth driving section, have a predetermined ratio, respectively, and by current return paths between the output terminals and at least one of the supply rails.

4. A bridged driving amplifier according to claim 3, wherein the ratio is such that the current driving capability of the second and the fourth driving section is a fraction of the current driving capability of the first and the third driving section, respectively.

5. A telecommunication device comprising a bridged driving amplifier for driving a capacitive load which is coupled between a first and a second output terminal of the bridged driving amplifier, which bridged driving amplifier comprises a first driving section coupled between a first supply rail and the first output terminal, a second driving section coupled between the second output terminal and a second supply rail, a third driving section coupled between the first supply rail and the second output terminal, and a fourth driving section coupled between the first output terminal and the second supply rail, whereby the bridged driving amplifier is AC-driven such that the first and the second section, when driven, cause an output voltage across the capacitive load of a given polarity, and the third and the fourth section, when driven, cause an output voltage across the capacitive load of a polarity opposite to the given polarity, the bridged driving amplifier further comprising inhibiting means for inhibiting that at least a part of the supply current is inhibited when discharging the capacitive load during voltage state changing of the voltage across the capacitive load from the one polarity to the other polarity, the inhibiting means being formed by arranging that the current driving capabilities of the first and second driving section, and the third and fourth driving section, have a predetermined ratio, respectively, and by current return paths between the output terminals and at least one of the supply rails, and the capacitive load being a piezo electrical acoustic transducer for generating a ringing signal.

* * * * *